(12) United States Patent
Kim et al.

(10) Patent No.: US 12,074,697 B2
(45) Date of Patent: Aug. 27, 2024

(54) ENCODING DATA

(71) Applicant: FUJITSU LIMITED, Kawasaki (JP)

(72) Inventors: Inwoong Kim, Allen, TX (US); Olga I Vassilieva, Plano, TX (US); Paparao Palacharla, Plano, TX (US)

(73) Assignee: FUJITSU LIMITED, Kanagawa (JP)

( * ) Notice: Subject to any disclaimer, the term of this patent is extended or adjusted under 35 U.S.C. 154(b) by 567 days.

(21) Appl. No.: 17/361,136

(22) Filed: Jun. 28, 2021

(65) Prior Publication Data
US 2022/0416935 A1 Dec. 29, 2022

(51) Int. Cl.
| | | |
|---|---|---|
| H04L 1/00 | (2006.01) | |
| H03M 7/30 | (2006.01) | |
| H04L 1/20 | (2006.01) | |
| H04L 27/34 | (2006.01) | |
| H04L 27/36 | (2006.01) | |

(52) U.S. Cl.
CPC ......... *H04L 1/0023* (2013.01); *H03M 7/6011* (2013.01); *H03M 7/6047* (2013.01); *H04L 1/0003* (2013.01); *H04L 1/0033* (2013.01); *H04L 1/206* (2013.01); *H04L 27/3405* (2013.01); *H04L 27/362* (2013.01)

(58) Field of Classification Search
CPC ... H04L 1/0023; H04L 1/0003; H04L 1/0033; H04L 1/206; H04L 27/3405; H04L 27/362; H03M 7/6011; H03M 7/6047
See application file for complete search history.

(56) References Cited

U.S. PATENT DOCUMENTS

| | | | | |
|---|---|---|---|---|
| 10,069,519 | B1* | 9/2018 | Millar | H04L 1/0042 |
| 10,587,358 | B1* | 3/2020 | Ebrahimzad | H04B 10/541 |
| 2018/0026725 | A1* | 1/2018 | Cho | H04L 1/0042 |
| | | | | 714/776 |
| 2019/0052509 | A1* | 2/2019 | Krishnan | H04L 1/0043 |
| 2020/0014407 | A1* | 1/2020 | Smith | H04L 27/04 |
| 2020/0313773 | A1* | 10/2020 | Torbatian | H04L 1/0052 |
| 2022/0294538 | A1* | 9/2022 | Harley | H04L 27/2657 |
| 2023/0043960 | A1* | 2/2023 | Qu | H04B 10/541 |

* cited by examiner

*Primary Examiner* — Freshteh N Aghdam
(74) *Attorney, Agent, or Firm* — Maschoff Brennan

(57) ABSTRACT

An example method may include obtaining multiple symbols each associated with a different state in a quadrature amplitude modulation scheme used for transmission of a data signal. The method may further include determining a sequence of symbols of the multiple symbols for a first portion of the data signal. The determining may include selecting an index value from multiple index values for the first portion of the data signal. The determining may also include obtaining energy states of multiple sequences of the symbols using the energy levels of the symbols. The determining may further include obtaining a relationship between the energy levels of the symbols, the energy states of the multiple sequences of the symbols, and the multiple index values. The determining may further include selecting the sequence of symbols based on the relationship and the index value for the first portion of the data signal.

19 Claims, 7 Drawing Sheets

ENCODING DATA

The embodiments discussed in the present disclosure are related to encoding data.

BACKGROUND

Transmitting data over a channel may encounter noise and other channel defects that may limit the data rate of the transmitted data. Further, improved data speeds are often desired which may be limited by the channel defects. In some circumstances, data transmission over a channel may be improved by modulating the data to be transmitted by a transmission system and demodulating the received signal by a receiving system. The modulation may include phase shift keying (PSK), frequency shift keying (FSK), amplitude shift keying (ASK), and/or quadrature amplitude modulation (QAM), which may include elements of PSK and ASK.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

In an embodiment, a method may include obtaining multiple symbols each associated with a different state in a quadrature amplitude modulation scheme used for transmission of a data signal. Each of the symbols may be associated with an energy level of transmission of the data signal. The method may further include determining a sequence of symbols of the multiple symbols for a first portion of the data signal. The determining may include selecting an index value from multiple index values for the first portion of the data signal. The index value selected may be based on the first portion of the data signal. The determining may also include obtaining energy states of multiple sequences of the symbols using the energy levels of the symbols. The multiple sequences of the symbols may include the sequence of symbols. The determining may further include obtaining a relationship between the energy levels of the symbols, the energy states of the multiple sequences of the symbols, and the multiple index values. The determining may further include selecting the sequence of symbols based on the relationship and the index value for the first portion of the data signal.

The objects and advantages of the embodiments will be realized and achieved at least by the elements, features, and combinations particularly pointed out in the claims.

Both the foregoing general description and the following detailed description are given as examples and are explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Transmitting data using quadrature amplitude modulation (QAM) enables a greater amount of data to be transmitted when compared to other modulation schemes, like phase shift keying (PSK), frequency shift keying (FSK), and amplitude shift keying (ASK). Data rates using QAM is typically dependent on the number of constellation points in the QAM. Thus, an increase in the number of constellation points in the QAM may result in an increase in data rate. Increasing the number of constellation points may occur in conjunction with improvements and/or higher cost equipment used in transmitting and receiving a data signal. Additionally, increasing the number of constellation points may result in differences between constellation points being reduced which may cause more difficulty in distinguishing constellation symbols in view of noise and other impairments in the transmission channel.

Further, transmission rate granularity may be limited as constellation points are often arranged in square patterns (e.g., 4QAM, 16QAM, 64QAM, etc.) such that a desired small increase in transmission rate may include a large jump in the number of symbols, which may relate to a large increase in transmission costs.

In some embodiments of the present disclosure, encoding data may be implemented in square and non-square QAM schemes and may improve transmission characteristics in a transmission system. For example, lower power symbols may be selected more often in modulating data to be transmitted, which may reduce costs associated with data transmission. Additionally, transmitting lower power symbols more frequently may increase the distance between constellation symbols for a given signal power such that a signal to noise ratio associated with the symbols may be improved. Further, higher granularity data transmission schemes may be achieved by adjusting the probability of constellation symbols being selected for the data transmission. For example, desired changes in the data transmission rate may be tuned in smaller increments.

In some embodiments of the present disclosure, encoding data may include probabilistic constellation shaping. The encoding may include obtaining symbols of a QAM scheme where each of the symbols are associated with an energy level of transmission. The QAM scheme may be of any shape and need not be square. During the encoding, sequences of the symbols may be determined for portions of a data signal. For example, each analogous portion of the data signal may be assigned a particular sequence of the symbols. The symbols for a particular sequence may be determined based on a relationship between the energy levels of the symbols, energy states of the sequences of the symbols, and index values associated with the portions of the data signals.

Figure 1:
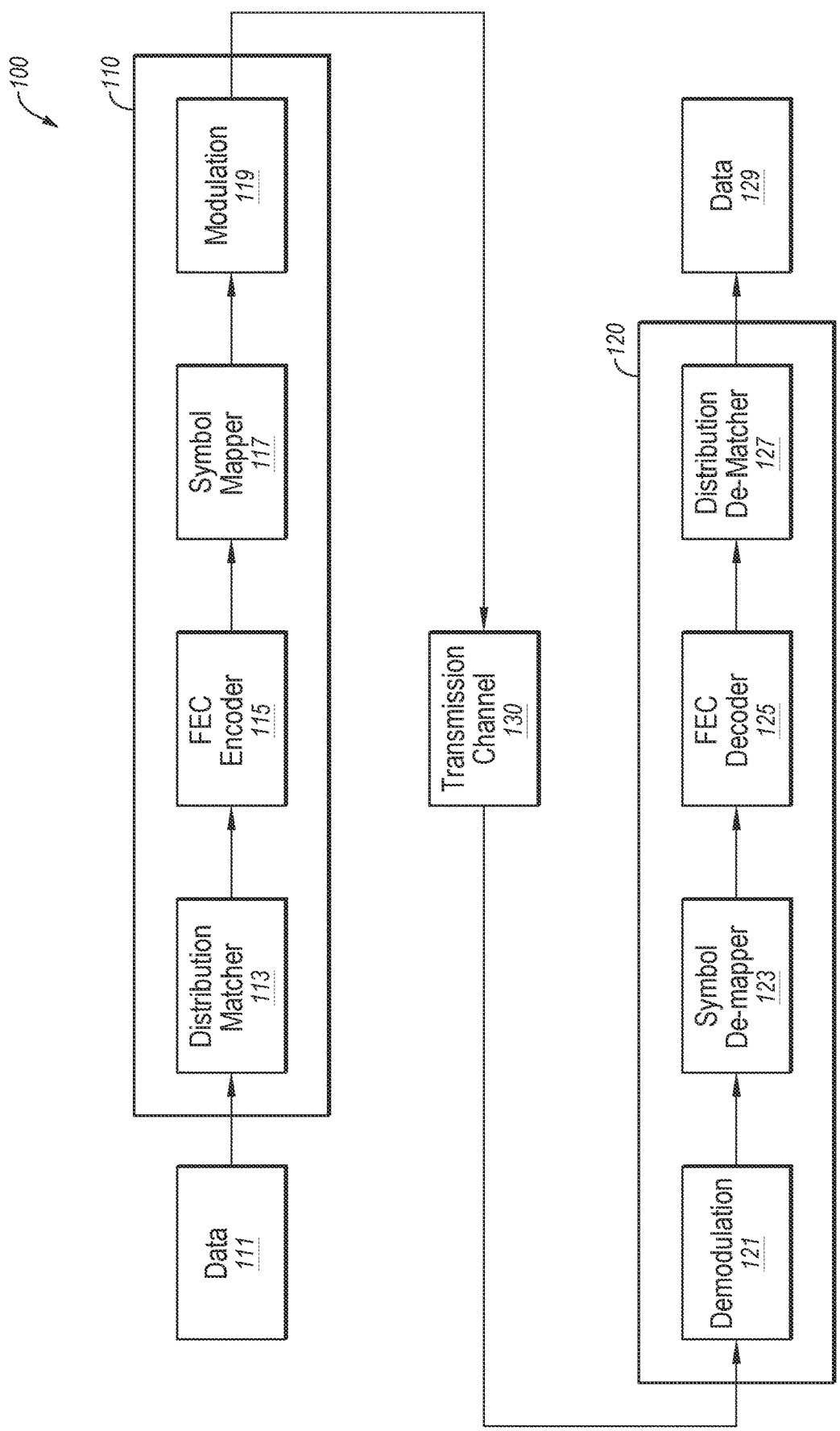
FIG. 1 illustrates a block diagram of an example environment for encoding and decoding data.

FIG. 1 illustrates a block diagram of an example environment 100 for encoding and decoding data. The environment 100 may be arranged in accordance with at least one embodiment described in the present disclosure. In some embodiments, the environment 100 may include a communication model that may be configured to encode data or decode data. The environment 100 may include a transmitting unit 110, a receiving unit 120, and a transmission channel 130.

In some embodiments, the transmitting unit 110 may include one or more elements configured to receive an input signal, process the input signal, and transmit the input signal. For example, the transmitting unit 110 may include a distribution matcher 113, a forward error correction (FEC) encoder 115, a symbol mapper 117, and a modulator 119. In some embodiments, a data signal 111 may be obtained by the transmitting unit 110. For example, the data signal 111 may be obtained by the transmitting unit 110 to be transmitted to a receiving system, such as the receiving unit 120. In some embodiments, the data signal 111 may be a data stream to be transmitted over the transmission channel 130. In these and other embodiments, the data signal 111 may be a sequence of information, such as bits in a digital form. The sequence of information may be uniform in that sequences of ones and zeros may include equal probabilities. In some embodiments, the data signal 111 may include a digital signal or an analog signal. In some embodiments, the transmitting unit 110 may include an analog to digital converter or a digital to analog converter to transform the data signal 111 in instances in which the data signal 111 is different than the transmitting unit 110 is configured to receive.

In some embodiments, the distribution matcher 113 may be configured to obtain the data signal 111. The distribution matcher 113 may be configured to encode the data signal 111, such as by performing probabilistic constellation shaping of the data signal 111. The data signal 111 may be encoded by determining a sequence of symbols that may represent the data signal 111. The sequence of symbols may be constructed to include a distribution of the symbols that is different from the distribution of the data in the data signal 111. A description regarding the construction of a sequence of symbols is now provided.

In some embodiments, the distribution matcher 113 may be configured to obtain symbols associated with a QAM scheme that may be used in the sequence of symbols. For example, in instances in which 64QAM is implemented, the distribution matcher 113 may obtain the sixty-four symbols used in the 64QAM. In some embodiments, the distribution matcher 113 may obtain a portion of the symbols that may be associated with a QAM scheme. For example, in instances in which a 64QAM is implemented, the distribution matcher 113 may obtain sixteen symbols of the sixty-four total symbols, which sixteen symbols may be associated with one quadrant of the QAM. In these and other embodiments, the symbols associated with a QAM scheme may be arranged in a constellation. In some embodiments, the constellation may be square. Alternatively or additionally, the constellation may include non-square constellations, such as circular, triangular, cross-shaped, and/or other non-square constellations. For example, the non-square constellations may be any number or arrangement of the symbols from a single quadrant of a QAM. For example, starting with a 64QAM configuration, any number of symbols such as 3, 6, 8, 10, 13, or 15 symbols, or some other number of the 16 symbols of a quadrant may be obtained for the non-square QAM. In short, any combination of the symbols of the QAM may be obtained.

In some embodiments, the distribution matcher 113 may be configured to obtain an energy level for the symbols in the QAM scheme. For example, each symbol may have an energy level associated with the symbol. In some embodiments, the energy level may represent a magnitude measured from the origin of the QAM scheme. In some embodiments, the energy level of a symbol may be determined by summing the square of the in-phase amplitude and the square of the quadrature amplitude. For example, a symbol with an in-phase amplitude equal to three and a quadrature amplitude equal to one may include an energy level of ten. In some embodiments, different symbols may include the same energy level. For example, a first symbol with an in-phase amplitude equal to seven and a quadrature amplitude equal to one may include the same energy level as a second symbol with an in-phase amplitude equal to five and a quadrature amplitude equal to five. The constellation 200a of FIG. 2A may include additional details regarding the energy level of the symbols in a QAM scheme.

In some embodiments, the distribution matcher 113 may be configured to obtain multiple sequences of the symbols associated with the QAM scheme. The sequences of the symbols may include combinations of the symbols arranged relative to other combinations of symbols. For example, for symbols A, B, and C with a sequence length of two, the multiple sequences of the symbols may include AB, AC, BC, BA, CA, and CB. In these and other embodiments, the sequence of symbols output by the distribution matcher 113 that represent the data signal 111 may be constructed of the multiple sequences of the symbols. For example, the distribution matcher 113 may construct the sequence of symbols output by the distribution matcher 113 that represent the data signal 111 by selecting from among the sequences of symbols.

In some embodiments, a sequence length for the sequences of symbols may be based on a block size selected for the transmission of the data signal 111. The block size may be selected based on hardware of the transmitting unit 110 and/or receiving unit 120, the transmission channel 120, among other factors regarding the transmission of the data signal 111.

In some embodiments, the distribution matcher 113 may determine energy states associated with the sequences of the symbols. For example, an energy state associated with a sequence of the symbols may include a sum of the energy levels associated with the symbols that may be included in the sequence of the symbols. For example, assume that the symbol A includes an energy state of four and the symbol B includes an energy state of five. Thus, the energy state of the sequence of the symbols AB may be nine. Furthermore, a first symbol position of the sequence of the symbols AB may include an energy state of four and a second symbol position of the sequence of the symbols AB may include an energy state of five. Thus, a sequence of symbols may include multiple energy states including an energy state for each symbol position and a final energy state. The energy state for each symbol position may be equal to a summation of the energy state for each preceding symbol position.

For example, for a sequence of symbols ABC, with the symbol A including energy of one, the symbol B including energy of four, and the symbol C include energy of six, the final energy state may be eleven, the first symbol position may include an energy state of one, the second symbol position may include an energy state of five, and the third symbol position may include an energy state of eleven, which may be the final energy state.

In some embodiments, the distribution matcher 113 may obtain an indication of a maximum energy level for a sequence of the symbols. The maximum energy level may be selected based on a configuration of the environment 100 and/or requirements for transmission of the data signal 111.

For example, the maximum energy level may be calculated based on the transmission channel 120, signal to noise requirements for transmission of the data signal 111, data rates for transmission of the data signal 111, among other factors regarding the transmission of the data signal 111 such as target entropy, output block size, target data rate, and/or data type included in the calculation.

In these and other embodiments, the sequences of symbols that may be obtained by the distribution matcher 113 may be limited by the maximum energy level. For example, only those sequences of symbols with an energy state less than or equal to the maximum energy level may be used by the distribution matcher 113 to construct the sequence of symbols output by the distribution matcher 113 that represent the data signal 111. For example, for sequences of the symbols that include AB, AC, BC, BA, CA, and CB, if sequences CA and CB include an energy level more than the maximum energy level, the sequences CA and CB may not be used to construct the sequence of symbols output by the distribution matcher 113 that represent the data signal 111.

In some embodiments, the distribution matcher 113 may be configured to parse the data signal 111. For example, the distribution matcher 113 may parse the data signal 111 to include portions of the data signal 111 with N number of bits. In some embodiments, the size of N may be determined such that a number of index values based on N may represent all possibilities of unique paths, or sequences of symbols, from an initial energy state to a final energy state. For example, in instances in which a number of index values may be needed to represent all sequences of symbols, the number of bits N included in a portion of the data signal 111 may be selected such that $2^N$ may be less all the unique sequences of symbols. For example, given the sequences of symbols AB, AC, BC, BA, CA, and CB from above, N may be equal to two, as four (i.e., $2^2$) is less than the number of sequences of symbols (i.e., six).

In some embodiments, the distribution matcher 113 may be configured to determine an index value to associate with each portion of the data signal 111. The number of index values may be based on the number of bits in each portion such that any combination of bits in each portion of the data signal 111 may be assigned to a unique index value. As such there may be a sufficient number of index values such that for any unique portion of the data signal 111 a unique index value may be associated with the unique portion of the data signal 111.

For example, given a first portion of the data signal 111, the distribution matcher 113 may determine a first index value which may be associated with the first portion of the data signal 111. Furthermore, given a second portion of the data signal 111 different from the first portion, the distribution matcher 113 may determine a second index value that may be associated with the second portion of the data signal 111. Additionally, in instances where a third portion of the data signal 111 is equivalent to the first portion of the data signal 111, the distribution matcher 113 may associate the same index value with the first portion and the third portion of the data signal 111.

In some embodiments, the index value associate with a portion of the data signal 111 may be determined from a portion of the data signal 111. For example, in instances in which the data signal 111 includes binary data represented as bits of data, the index value may include a binary to decimal conversion of a portion of the data signal 111. For example, given a portion of a data signal equal to 0101, the index value selected based on the portion of the data signal may be five. Alternatively or additionally, the index value may be determined using different methods of conversion to portions of the data signal. For example, gray code to decimal conversion, lookup tables, and/or other similar conversion methods may be implemented to determine an index value from a portion of a data signal.

In some embodiments, the distribution matcher 113 may obtain a relationship between the energy levels of the symbols, the energy states of the sequences of the symbols, and the index values. In some embodiments, the relationship may be based on a representation of the energy states of the sequences of the symbols organized based on the number of symbols in each of the sequence of symbols with links between the energy states that are associated with the energy levels of the symbols. For example, the representation may be visualized graphically. However, the representation may be represented using matrices, vectors, or other mathematical formulas that may represent a relationship between data that may be visually represented by a graph. In these and other embodiments, the graph may include an energy trellis.

For example, in some embodiments, the representation may include nodes that represent the energy states of the sequences of symbols. For example, the representation may include nodes for each energy state for each symbol position for each sequence of symbols. The nodes may be organized in rows and columns. In these and other embodiments, a number of columns may be based on a number of symbols in the sequence of symbols and a number of rows may be based on the maximum energy level and the energy levels of the symbols.

In these and other embodiments, in the representation, one energy state of the sequences of the symbols may include links from a prior energy state of the sequences of the symbols and/or links to a next energy state of the sequences of the symbols. In some embodiments, the links between the energy states may be associated with the energy level for the symbols that may equal an energy difference between the energy states. For example, a first link from a first energy state to a second energy state may be associated with an energy level of a first symbol in a QAM scheme that is equal to an energy difference between the first and second energy states. In some embodiments, an energy difference between two energy states may be equal to the energy level of multiple symbols. In these and other embodiments, a link for each of the multiple symbols with energy levels equal to the energy difference between two energy states may be represented between the two energy states.

In some embodiments, the distribution matcher 113 may be configured to determine a number of paths from an initial energy state to a final energy state, where a path may include a set of links from the initial energy state to a final energy state. For example, the distribution matcher 113 may iteratively determine a number of paths from the initial energy state to all next energy states, until the final energy states are reached, and the distribution matcher 113 may sum the results of all the paths included between the initial energy state and the final energy states. In some embodiments, a number of the index values, that is how many unique index values are used by the distribution matcher 113, may be based on a number of paths between all the energy states, such as all of the links in the representation. In these and other embodiments, the number of links may be based on the energy levels of the symbols used by the distribution matcher 113 and as a basis for the representation. As such, the number of the index values may be based on the energy levels of the symbols.

In some embodiments, the distribution matcher 113 may be configured to select a sequence of symbols for each portion of the data signal 111. For example, for each N number of bits in the data signal 111, the distribution matcher 113 may select a corresponding sequence of symbols and output the corresponding sequence of symbols.

In some embodiments, the distribution matcher 113 may select a sequence of symbols for a portion of the data signal 111 based on the index value for the portion of the data signal 111 and the relationship between the energy levels of the symbols, the energy states of the sequences of the symbols, and the index values. In these and other embodiments, the distribution matcher 113 may be configured to use the representation of the energy states of the sequences of the symbols, the links between the energy states, and the index value of the portion of the data signal 111 to select the sequence of symbols. For example, the distribution matcher 113 may select each symbol in the sequence of symbols using the representation of the energy states of the sequences of the symbols, the links between the energy states, and the index value of the portion of the data signal 111.

As an example for selecting symbols for the sequence of symbols for the portion of the data signal 111, the distribution matcher 113 may select a path between the energy states using the paths between the energy states based on comparing the index value of the portion of the data signal 111 to a number of paths from a current energy state to a final energy state. The selected path may follow links between the energy states. The symbols associated with the links included in the selected path may be selected for the sequence of symbols. The method 400 of FIG. 4 may include additional details regarding the relationship between the energy states of the sequences of the symbols, the energy levels of the symbols, and the index values.

As described, the distribution matcher 113 may be configured to select a sequence of symbols for each portion of the data signal 111 as the data signal 111 is provided to the distribution matcher 113. As such, the distribution matcher 113 may select sequences of symbols for the data signal 111 in real-time as part of transmission of the data signal 111. Furthermore, for a given sequence of data of the data signal 111, the distribution matcher 113 may select the same sequence of symbols. For example, in instances in which the data signal 111 includes two different portions of data that include identical data elements arranged in the same order, the distribution matcher 113 may determine the first portion of data and the second portion of data of the data signal 111 may be represented by the same sequence of symbols.

In some embodiments, the distribution matcher 113 may determine the sequence of symbols that may represent the data signal 111 such that lower power symbols may be more likely to be selected. For example, the distribution matcher 113 may implement a method, such as the method 400, which may be configured to such that more low energy symbols are output by the distribution matcher 113 than high energy symbols. In short, the QAM may be probabilistically shaped to such that an unequal distribution of symbols is output by the distribution matcher 113 with an equal distribution of bits of the data signal 111 provided to the distribution matcher 113. Inputs to the distribution matcher 113 may change the distribution of symbols selected. For example, the number of symbols included in the sequences of symbols, a maximum energy level for sequences of symbols, a number of symbol, energy levels of the symbols, and/or other characteristics related to the symbols and the energy level of the transmission of the data signal 111 system 100 may be adjusted which may change the distribution of symbols selected.

In some embodiments, the distribution matcher 113 may be implemented as a software module. For example, the distribution matcher 113 may be included in a digital signal processing software that may be executed by a digital signal processor In some embodiments, the FEC encoder 115 may be configured to distribute the output from the distribution matcher 113 to different quadrants of the QAM scheme. In instances in which the distribution matcher 113 produces symbols in a single quadrant of the QAM scheme, the FEC encoder 115 may be configured to redistribute the symbols into any one of the four quadrants of the QAM scheme. In some embodiments, two or more bits may be appended to a portion of the data signal 111 by the FEC encoder 115 to indicate which quadrant the portion of the data signal 111 may be disposed. For example, appended bits 11 may indicate the first quadrant, appended bits 01 may indicate the second quadrant, appended bits 10 may indicate the third quadrant, and appended bits 00 may indicate the fourth quadrant. In some embodiments, the FEC encoder 115 may be configured to equally distribute the symbols from the distribution matcher 113 into the four quadrants of the QAM scheme. Alternatively or additionally, the FEC encoder 115 and/or the FEC decoder 125 may be configured to correct and/or control errors that may be introduced by transmission in the transmission channel 130. In some embodiments, the FEC encoder 115 may be implemented as a software module. For example, the FEC encoder 115 may be included in the same digital signal processing software as the distribution matcher 113. Alternatively or additionally, the FEC encoder 115 may be configured to operate in a separate hardware system or in separate software from the distribution matcher 113.

In some embodiments, the symbol mapper 117 may be configured to obtain the output from the FEC encoder 115 and may be configured to generate transmittable symbols. In some embodiments, the symbol mapper 117 may be implemented as a software module. For example, the symbol mapper 117 may be included in the same digital signal processing software as the distribution matcher 113 and/or the FEC encoder 115. Alternatively or additionally, the symbol mapper 117 may be configured to operate in a separate hardware system or in separate software from the distribution matcher 113 and/or the FEC encoder 115.

In some embodiments, the modulator 119 may be configured to obtain the transmittable symbols from the symbol mapper 117 and modulate the transmittable symbols in preparation to be transmitted, such as over the transmission channel 130. In some embodiments, the modulator 119 may include distinct hardware configured to modulate signals. Alternatively or additionally, the modulator 119 may be implemented in the same or similar hardware as may be used from the distribution matcher 113, the FEC encoder 115, and/or the symbol mapper 117.

In some embodiments, the receiving unit 120 may include complementary elements to the transmitting unit 110. For example, the receiving unit 120 may include a demodulator 121, a symbol de-mapper 123, a FEC decoder 125, and a distribution de-matcher 127. In these and other embodiments, the demodulator 121 may be configured to demodulate the modulated signal from the modulator 119; the symbol de-mapper 123 may be configured to de-map the transmittable symbols from the symbol mapper 117; the FEC decoder 125 may be configured to decode the encoded symbols from the FEC encoder 115; and the distribution de-matcher 127 may be configured to convert the received symbols from the distribution matcher 113 back to an index value and to data of the data signal 111. As a result, the received data 129 may be the same or substantially similar as the data signal 111, having been transmitted through the transmission channel 130. In these and other embodiments, the receiving unit 120 may include elements in the reverse order as the transmitting unit 110, which elements of the receiving unit 120 may be configured to perform inverse functions to their complementary elements of the transmitting unit 110.

In some embodiments, the transmission channel 130 may include any transmission path configured to convey signals, such as electrical signals. In some embodiments, the transmission channel 130 may include a wired medium, a wireless medium, and/or combinations of wired and wireless mediums. For example, the transmission channel 130 may include twisted pair cables, coaxial cables, fiber optic cables, microwave transmissions, satellite transmissions, radio transmission, and/or infrared transmissions. Alternatively or additionally, the transmission channel 130 may be configured to support either of digital communications or analog communications.

Modifications, additions, or omissions may be made to the environment 100 without departing from the scope of the present disclosure. For example, in some embodiments, the environment 100 may include other devices/systems that may provide inputs to the distribution module 113, such as the input data 111, the maximum energy level, the symbols to select, the block size, among others.

Figure 2A:
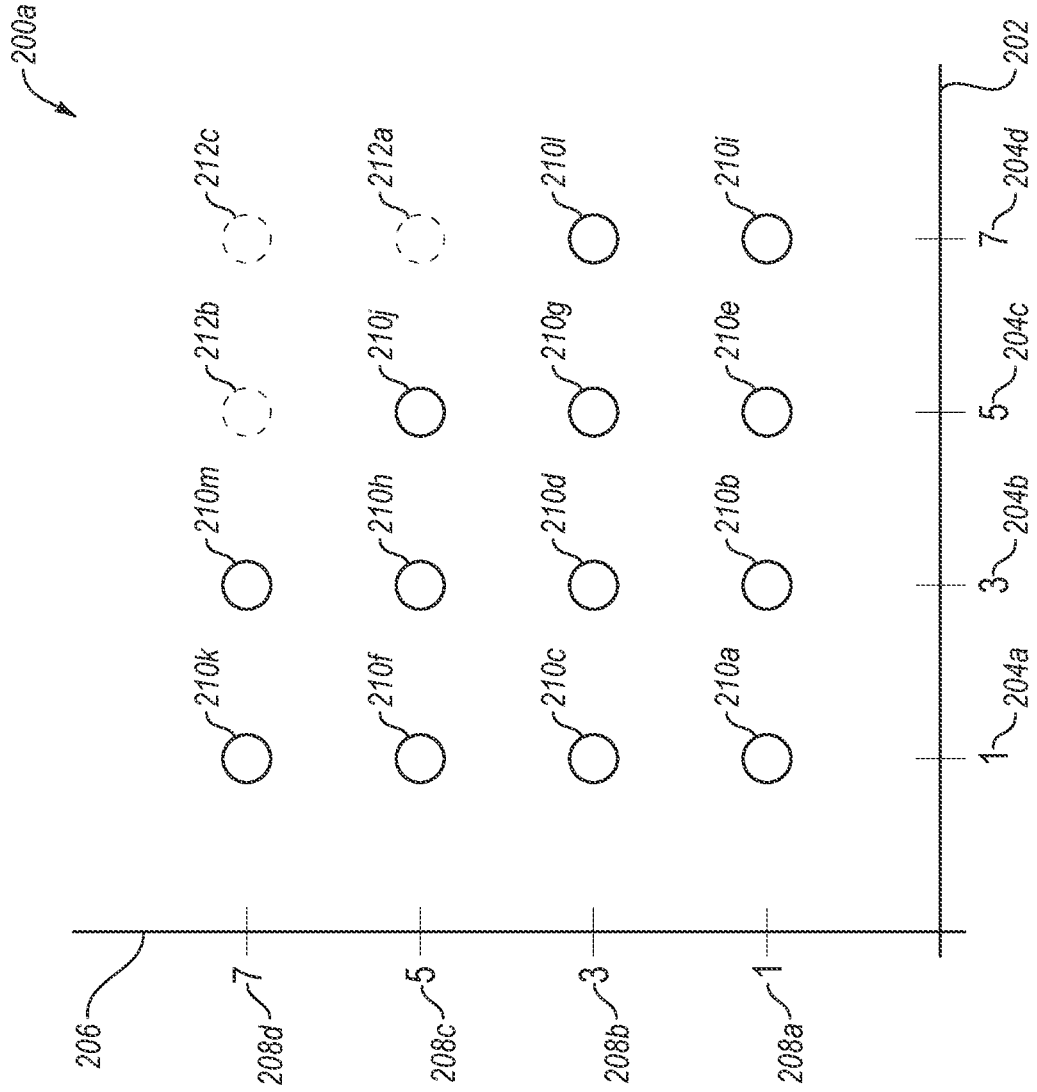
FIG. 2A illustrates an example constellation.

FIG. 2A illustrates an example constellation 200*a*. The constellation 200*a* may be arranged in accordance with at least one embodiment described in the present disclosure. The constellation 200*a* may include an in-phase axis 202, a quadrature axis 206, a first symbol 210*a*, a second symbol 210*b*, a third symbol 210*c*, a fourth symbol 210*d*, a fifth symbol 210*e*, a sixth symbol 210*f*, a seventh symbol 210*g*, an eighth symbol 210*h*, a ninth symbol 210*i*, a tenth symbol 210*j*, an eleventh symbol 210*k*, a twelfth symbol 210*l*, a thirteenth symbol 210*m*, referred to collectively as the symbols 210, a first excluded symbol 212*a*, a second excluded symbol 212*b*, and a third excluded symbol 212*c*, referred to collectively as the excluded symbols 212. The in-phase axis 202 may include a first in-phase amplitude 204*a*, a second in-phase amplitude 204*b*, a third in-phase amplitude 204*c*, and a fourth in-phase amplitude 204*d*, referred to collectively as the in-phase amplitudes 204. The quadrature axis 206 may include a first quadrature amplitude 208*a*, a second quadrature amplitude 208*b*, a third quadrature amplitude 208*c*, and a fourth quadrature amplitude 208*d*, referred to collectively as the quadrature amplitudes 208. In some embodiments, the constellation 200*a* may illustrate a first quadrant of a 64 QAM where the symbols thereof are labeled as the symbols 210 and the excluded symbols 212.

In some embodiments, the constellation 200*a* may illustrate one quadrant of a complete constellation. For example, as illustrated in FIG. 2A, the constellation 200*a* includes a top right quadrant of a complete constellation. In some embodiments, the in-phase axis 202 may include the in-phase amplitudes 204, which may be equally dispersed thereon. For example, each of the in-phase amplitudes 204 may be located two units apart. In some embodiments, the values associated with the in-phase amplitudes 204 may be an amplitude of the in-phase portion of the symbols 210. For example, the second symbol 210*b* may include an in-phase amplitude equal to three.

Similar to the in-phase axis 202, the quadrature axis 206 may include the quadrature amplitudes 208, which may be equally dispersed thereon, and the quadrature amplitudes 208 may be located two units apart. In some embodiments, the values associated with the quadrature amplitudes 208 may be an amplitude of the quadrature portion of the symbols 210. For example, the second symbol 210*b* may include a quadrature amplitude equal to one.

In these and other embodiments, the locations of the in-phase amplitudes 204 and the quadrature amplitudes 208 may be such that the symbols 210 may be equally spaced in each quadrant of a complete constellation. For example, in instances in which the first in-phase amplitude 204*a* and the first quadrature amplitude 208*a* are both one unit from the origin of the constellation 200*a*, each of the other quadrants of the complete constellation may include one unit from the origin for the first symbol such that all symbols in the complete constellation may be located an equal distance apart (i.e., two units apart along both the in-phase axis 202 and the quadrature axis 206).

In some embodiments, the constellation 200*a* may include the symbols 210 and/or the excluded symbols 212 uniformly dispersed along the in-phase axis 202 and the quadrature axis 206. For example, in instances in which the constellation 200*a* is a portion of a square QAM, all of the symbols 210 and the excluded symbols 212 may be included in the constellation 200*a*. Alternatively or additionally, the number of symbols in the constellation 200*a* may vary from a square-like arrangement. For example, the constellation 200*a* may include the symbols 210 and may not include the excluded symbols 212 such that the symbols in the constellation 200*a* are non-square. Although illustrated as three symbols included in the excluded symbols 212, there may be more or less symbols in the excluded symbols 212 such that any non-square constellation may be implemented. For example, the tenth symbol 210*j*, the twelfth symbol 210*l*, and the thirteenth symbol 210*m* may be included in the excluded symbols 212 such that the remaining included symbols may be triangular in the quadrant, which my result in a diamond shaped QAM. In these and other embodiments, the symbols further from the origin of the in-phase axis 202 and the quadrature axis 206 may be the first symbols to be excluded, as the symbols further from the origin may include a higher energy level than the symbols nearer to the origin.

In some embodiments, one or more symbols may be excluded from the constellation 200*a* based on transmission channel conditions, such as conditions of the transmission channel 130 of FIG. 1. For example, in instances in which the transmission channel includes a noisy channel, one or more symbols may be excluded from the constellation 200*a*. Alternatively or additionally, one or more symbols may be excluded from the constellation 200*a* based on hardware constraints. For example, in instances in which the hardware of the transmission of the symbols may be limited to a threshold number of symbols, one or more symbols may be excluded from the constellation 200*a*.

In some embodiments, the in-phase axis 202 may include the in-phase amplitudes 204 separated by an amplitude of two. Similarly, the quadrature axis 206 may include the quadrature amplitudes 208 separated by an amplitude of two. For example, the first in-phase amplitude 204*a* and the first quadrature amplitude 208*a* may include an amplitude of one, the second in-phase amplitude 204*b* and the second quadrature amplitude 208*b* may include an amplitude of three, and so forth.

The uniform spacing between the in-phase amplitudes 204 and the quadrature amplitudes 208 may contribute to the uniform distribution of the symbols 210. In these and other embodiments, the symbols 210 may be aligned with one of the in-phase amplitudes 204 and one of the quadrature amplitudes 208. For example, the third symbol 210c may be configured to align with the first quadrature amplitude 204a and the second quadrature amplitude 208b.

In some embodiments, the energy level associated with a symbol of the symbols 210 may be determined based on the location of the symbol relative to the in-phase axis 202 and the quadrature axis 206. In some embodiments, the energy level associated with a symbol may include a sum of the square of the in-phase amplitudes 204 and the square of the quadrature amplitudes 208. For example, the third symbol 210c may include an energy level of ten (i.e., one squared, from the first in-phase amplitude 204a, plus three squared from the second quadrature amplitude 208b). In some embodiments, more than one of the symbols 210 may include similar energy levels. For example, the second symbol 210b and the third symbol 210c may both have an energy level of ten.

In some embodiments, the energy levels of the symbols 210 may be used to determine the energy states of the sequences of the symbols. For example, the energy states of sequences of the symbols may be organized based on the number of symbols in the sequence of symbols, and the links between the energy states in a representation of the energy states of the sequences of the symbols as discussed with respect to FIG. 1 may be associated with the energy levels of the symbols 210.

Modifications, additions, or omissions may be made to the constellation 200a without departing from the scope of the present disclosure. For example, in some embodiments, the constellation 200a may include fewer or more symbols 210.

Figure 2B:
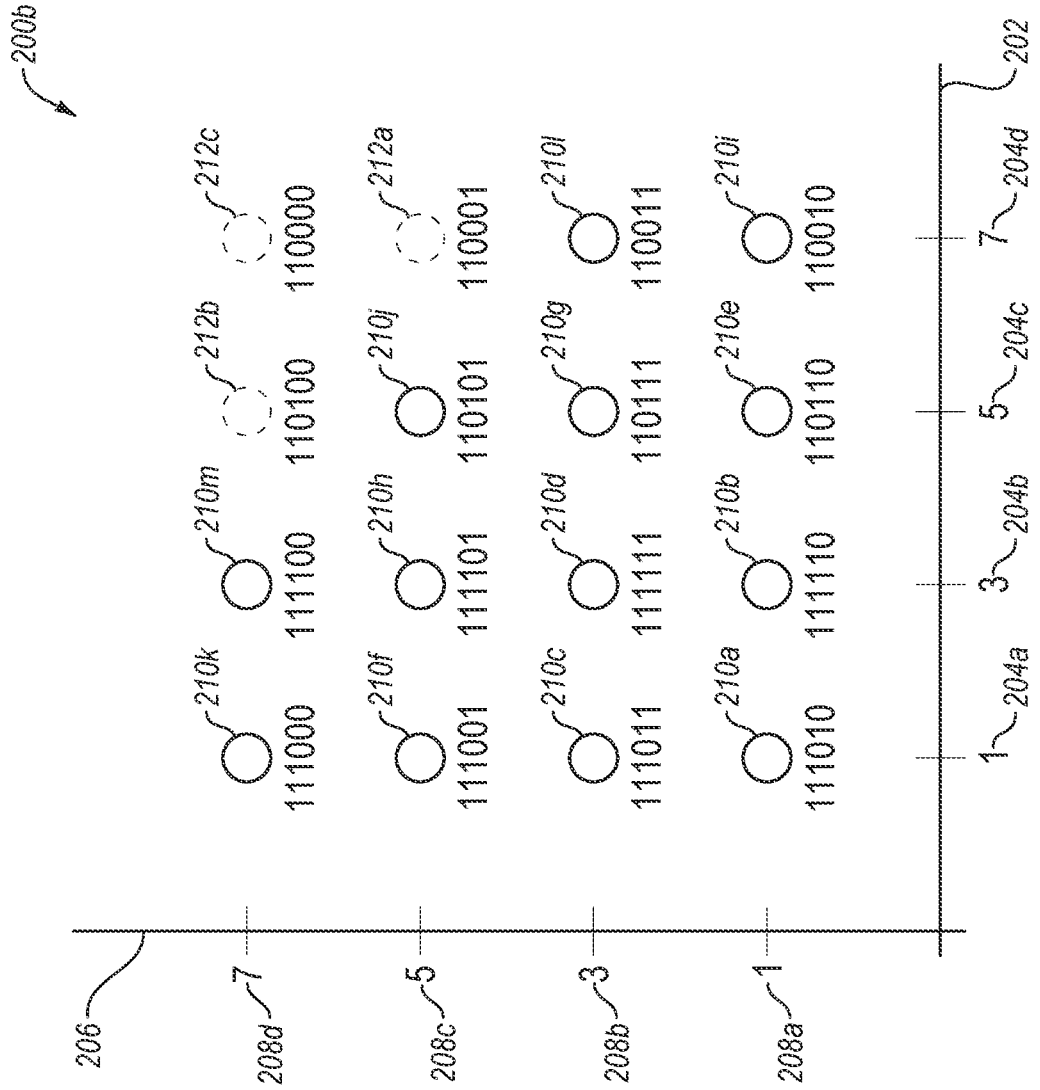
FIG. 2B illustrates an example constellation with gray codes and parity bits.

FIG. 2B illustrates an example constellation 200b with gray codes and parity bits, according to at least one embodiment described in the present disclosure. The constellation 200b may be analogous to the constellation 200a, including similar axes, amplitudes, and/or symbols.

In some embodiments, the symbols 210 and/or the excluded symbols 212 of the constellation 200b may include a binary label. For example, the first symbol 210a includes a binary label of 111010. In some embodiments, a first portion of the binary label may include parity bits that identify the quadrant the symbol may be located in. In some embodiments, a second portion of the binary label may include a number of bits that may represent a portion of probabilistically shaped data, such as a portion of an output from the distribution matcher 113. For example, the first two bits of the first symbol 210a equal to 11 may indicate the symbol may be in the first quadrant and the remaining 1010 may represent a portion of data associated with the first symbol 210a. Further, parity bits equal to 01 may indicate the symbol may be in the second quadrant, parity bits equal to 10 may indicate the symbol may be in the third quadrant, and parity bits equal to 00 may indicate the symbol may be in the fourth quadrant. In these and other embodiments, a FEC encoder, such as the FEC encoder 115 of FIG. 1, may be configured to distribute the symbols into the four quadrants by assigning the parity bits to the symbol, such that each quadrant includes an approximately equal number of symbols.

In some embodiments, the distribution matcher 113 and the distribution de-matcher 127 of FIG. 1 may be configured to perform operations on the second portion of the binary label. Therefore, the FEC encoder 115 of FIG. 1 may be configured to add the parity bits to the binary label following the operations of the distribution matcher 113 and the FEC decoder 125 of FIG. 1 may be configured to remove the parity bits from the binary label prior to operations being performed by the distribution de-matcher 127.

Figure 3:
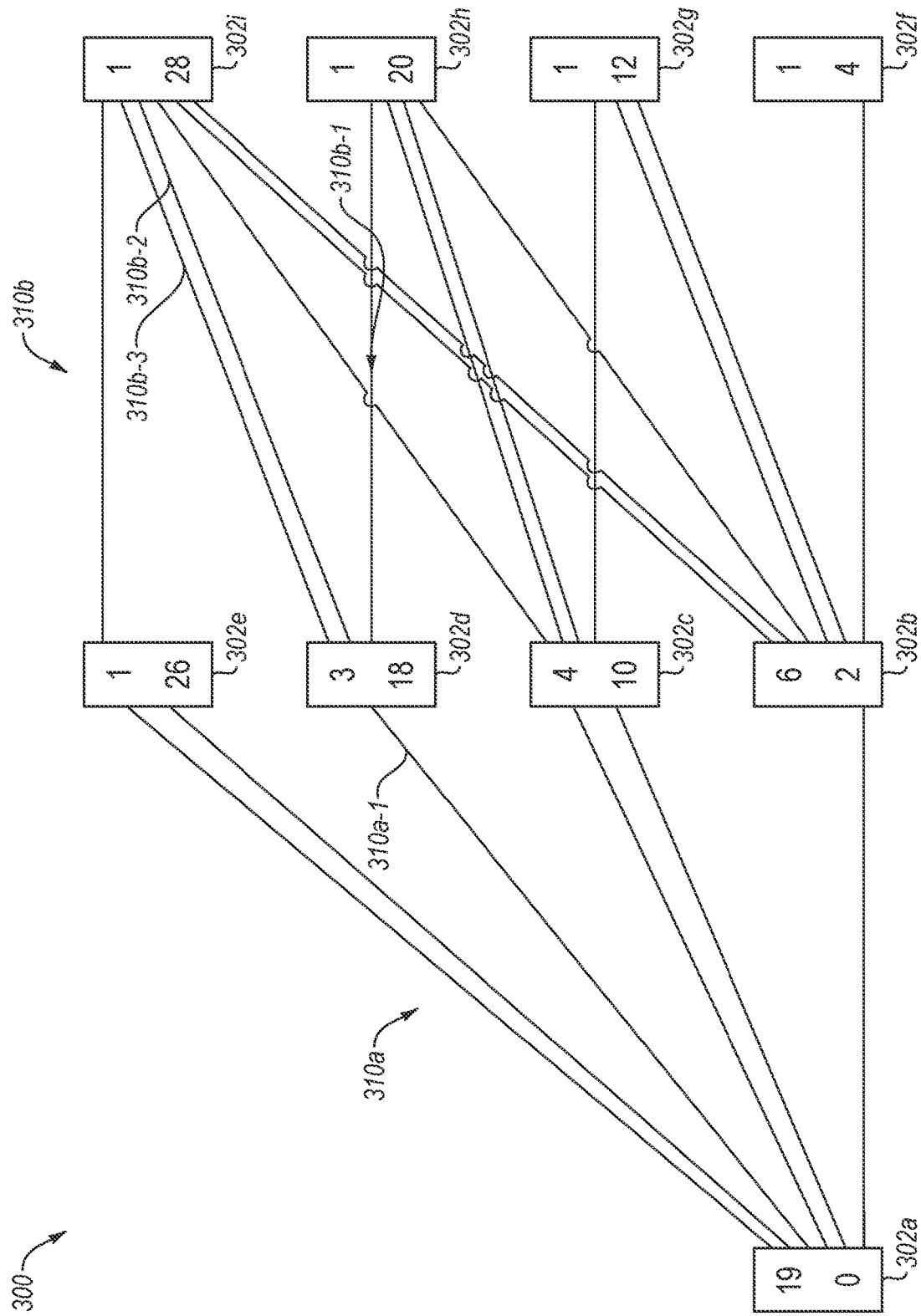
FIG. 3 illustrates an example visualization of a representation of energy states used in selecting sequences of symbols to encode data.

FIG. 3 illustrates an example visualization 300 of a representation of energy states used in selecting sequences of symbols to encode data. The visualization 300 may be arranged in accordance with at least one embodiment described in the present disclosure. The visualization 300 may include an initial energy state 302a, a first energy state 302b, a second energy state 302c, a third energy state 302d, a fourth energy state 302e, a fifth energy state 302f, a sixth energy state 302g, a seventh energy state 302h, an eighth energy state 302i, referred to collectively as the energy states 302. The energy states 302 may represent energy states of sequences of symbols. The visualization 300 may also include first links 310a, and second links 310b, referred to collectively as the links 310. The links 310 may include a first link 310a-1, a second link 310b-1, a third link 310b-2, and a fourth link 310b-3.

In some embodiments, the energy states 302 may be arranged in rows and columns. Alternatively or additionally, the arrangement of the energy states 302 in rows and columns may simply provide a visual representation of the arrangement and/or connections between the energy states 302.

As illustrated, the number of columns may be based on the number of symbols in a sequence of symbols. For example, the number of columns may be equal to the number of symbols in a sequence of symbols plus one additional column for the first column. Each of the columns besides the first column may represent energy states of a particular symbol position in a sequence of symbols.

For example, in some embodiments, the first column of the energy states 302 may include a single energy state, or the initial energy state 302a. In some embodiments, the last column, or the right-most column of the energy states 302 in the visualization 300, may include final energy states. For example, the final energy states may include the fifth energy state 302f, the sixth energy state 302g, the seventh energy state 302h, and the eighth energy state 302i. The first energy state 302b, the second energy state 302c, the third energy state 302d, the fourth energy state 302e may represent energy states of a first symbol position.

In some embodiments, as illustrated, the number of rows may be based on the maximum energy level of sequences of symbols. The energy levels of the energy states 302 may not be larger than the maximum energy level of the sequences of the symbols.

In some embodiments, each energy state of the energy states 302 may include two values. A first value of the two values may be associated with a number of paths from the current energy state to one or more of the final energy states and a second value of the two values may be associated with a total energy level from the initial energy state 302a. In some embodiments, the first value may include a default value of one. For example, the final energy states may include a first value equal to one, even in instances in which there are no paths from the current energy state to the final energy states (i.e., the current energy state is the final energy state).

In some embodiments, the initial energy state 302a may include the first value that may represent the total number of paths from the initial energy state 302a to the final energy states. For example, the initial energy state 302a includes the first value of 19, which may include the total number of paths to the final energy states. In some embodiments, the first value for the energy states 302 may be determined by adding the first value of the adjacent column of energy states, starting in the same row and adding subsequently higher rows of the energy states 302. Further, in instances in which the adjacent column of energy states includes more than one path between the current energy state and the adjacent energy state, the first value of the adjacent energy state may be equal to the number of paths connecting the current energy state to the adjacent energy state. For example, the first value in the second energy state 302c as illustrated is four, which may be determined by adding the first value of the sixth energy state 302g, the first value of the seventh energy state 302h twice (once for each outgoing path from the second energy state 302c), and the first value of the eighth energy state 302i.

In some embodiments, the initial energy state 302a may include a second value equal to zero as no symbols are in the sequence such that the energy level of the sequence of symbols is zero. In some embodiments, the second value in the energy states 302 may be determined based on the energy level associated with the links between the energy states 302.

In some embodiments, the energy states 302 may be connected by the links 310. For example, the initial energy state 302a may be connected to the adjacent column of the energy states 302 by the first links 310a. In some embodiments, each link in the links 310a may be associated with a symbol, such as a symbol of the symbols 210 of FIG. 2A. Alternatively or additionally, each link of the first links 310a associated with a symbol may include an energy level, which may be associated with the symbol. For example, the link between the initial energy state 302a and the first energy state 302b may be associated with a first symbol, such as the first symbol 210a of FIG. 2A, which may include an associated energy level of two. Further, the sum of the second value of the current energy state and the energy level associated with the link may be the second value of the adjacent energy state of adjacent column. For example, the link between the initial energy state 302a and the first energy state 302b that included a power of two, is summed with the second value of the initial energy state 302a (i.e., two is added to zero), and the result is the second value of the first energy state 302b (i.e., two).

The second value of the energy states 302 may represent the total energy level associated with an energy level amount that may be used to reach the energy state, as measured from the initial energy state 302a. In some embodiments, the second value may remain the same total energy level regardless of the number of incoming links to the current energy state. For example, the fourth energy state 302e may include a second value equal to twenty-six, even with multiple links, each associated with an energy level equal to twenty-six, connected to the fourth energy state 302e.

In some embodiments, the total energy level may represent an energy level of a complete or partial sequence of symbols. For example, the total energy level of the energy states in the first column may represent the energy level of a partial sequence of symbols, each partial sequence of symbols including one symbol and including a symbol that is represented by a link between the initial energy state 302a and the energy states in the first column. For example, at the third energy state 302d, the partial sequence of symbols may include the symbol associated with the link between the third energy state 302d and the initial energy state 302a and may have an energy level of eighteen.

In some embodiments, the second links 310b may be equivalent to some or all of the first links 310a. For example, the second links 310b outgoing from the first energy state 302b may be the same as the first links 310a outgoing from the initial energy state 302a. In some embodiments, the second links 310b may be limited in the number of the energy states 302 to which the second links 310b may connect. For example, the second links 310b outgoing from the third energy state 302d may be limited to three links, where a first link may connect to the seventh energy state 302h, and the second and third links may connect to the eighth energy state 302i.

In an example, the first link 310a-1 may be associated with a symbol, such as the fourth symbol 210d of FIG. 2A. Accordingly, the first link 310a-1 may be associated with an energy level equal to the energy level of the fourth symbol 210d, which may be equal to eighteen. The second link 310b-1, the third link 310b-2, and the fourth link 310b-3 may be associated with three symbols, such as the first symbol 210a, the second symbol 210b, and the third symbol 210c of FIG. 2A, respectively. Accordingly, the second link 310b-1, the third link 310b-2, and the fourth link 310b-3 may be associated with energy levels equal to the energy level of the first symbol 210a, the second symbol 210b, and the third symbol 210c, respectively, which may be equal to two, ten, and ten, respectively. Alternatively or additionally, different links of the links 310 may be associated with the same symbol. For example, the second link 310b-1 and all other horizontal links as illustrated (i.e., the link between the initial energy state 302a and the first energy state 302b, the link between the first energy state 302b and the fifth energy state 302f, the link between the second energy state 302c and the sixth energy state 302g, etc.) may be associated with the same symbol, such as the first symbol 210a of FIG. 2A.

A path followed through the energy states 302 may provide symbols for a sequence of symbols. For example, a path from the initial energy state 302a to the third energy state 302d and then to the seventh energy state 302h may a provide first and second symbols for a sequence of symbols. The first symbol may be selected based on the first symbol being represented by the link between the initial energy state 302a and the third energy state 302d. The second symbol may be selected based on the second symbol being represented by the link between the third energy state 302d and the seventh energy state 302h.

Figure 4:
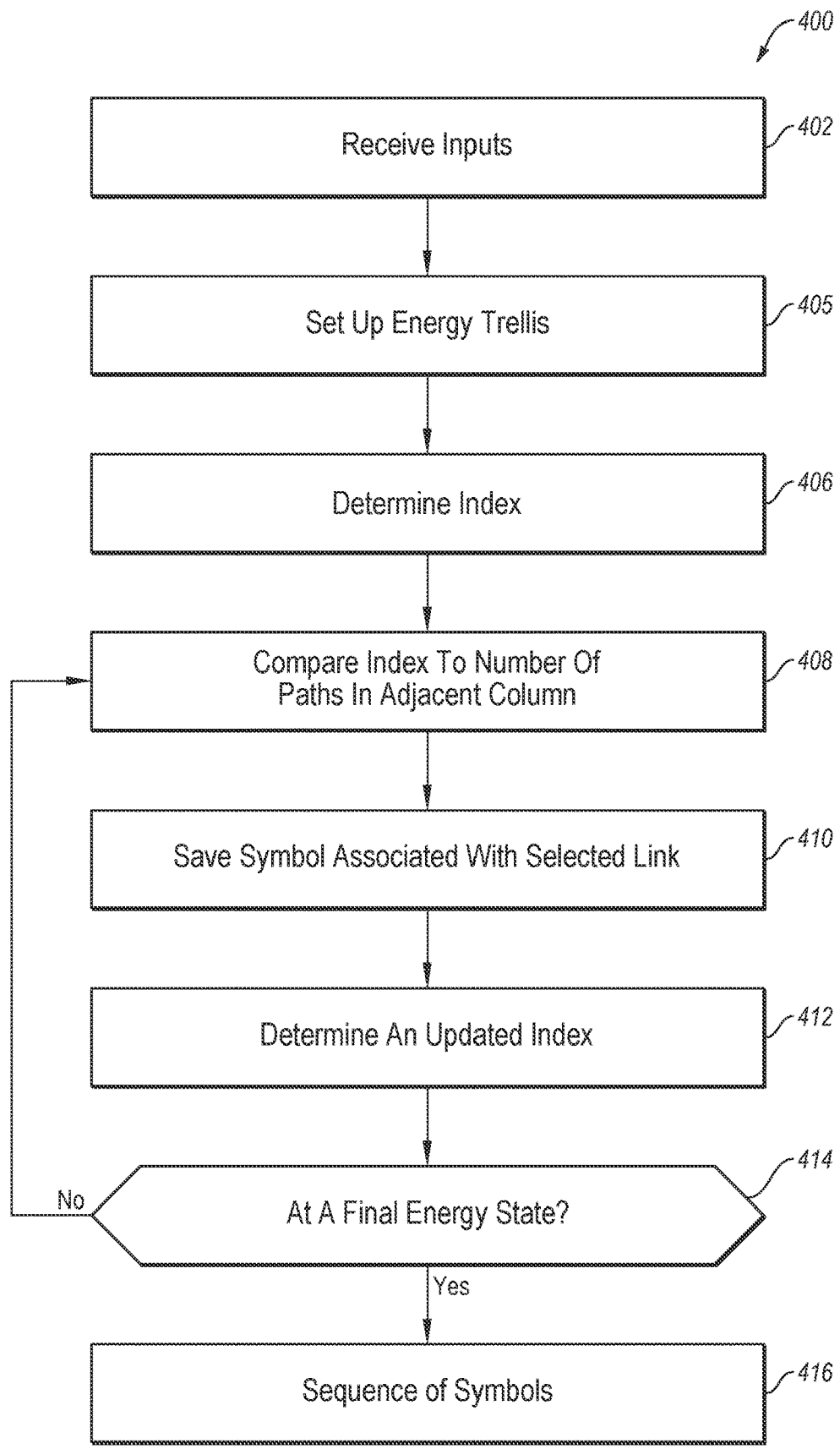
FIG. 4 illustrates a flowchart of an example method of selecting symbols to encode data.

A path may be selected through the energy states 302 based on comparing an index value of a portion of a data signal to a number of paths from a current energy state to a final energy state as explained in more detail with respect to FIG. 4.

Modifications, additions, or omissions may be made to the visualization 300 without departing from the scope of the present disclosure. For example, in some embodiments, the visualization 300 may include more or fewer rows, columns, and/or links.

FIG. 4 illustrates a flowchart of an example method 400 of selecting symbols to encode data. The method 400 may be arranged in accordance with at least one embodiment described in the present disclosure. One or more operations of the method 400 may be performed, in some embodiments, by a device or system, such as the distribution matcher 113 of FIG. 1, the system 600 of FIG. 6, or another device, combination of devices, or system. In these and other embodiments, the method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

In some embodiments, the method 400 may be configured to iteratively select symbols to be included in a sequence of symbols associated with a portion of data, such as a portion of the data signal 111 of FIG. 1. For example, the method 400 may select symbols to be included in the sequence of symbols until an end condition is reached.

In some embodiments, the method 400 may begin at block 402. At block 402, one or more inputs may be obtained. In some embodiments, the inputs may include a data signal, symbols that may be included in a QAM scheme, a number of symbols to include in the sequence of symbols, and a maximum energy for the sequence of symbols. In some embodiments, the data signal and the symbols may be analogous to the data signal 111 of FIG. 1 and the symbols 210 of FIG. 2A, respectively. In some embodiments, the symbols may also include an energy level, which may be determined by summing the squares of the in-phase and quadrature amplitudes of the symbol, as described in FIG. 2A. In some embodiments, the number of symbols included in the sequence of symbols may be determined based on hardware used in association with the method 400. Further, the maximum energy for the sequence of symbols may be calculated based on target entropy, output block size, target data rate, and/or data type related to the data signal, the symbols, and/or the hardware used in association with the method 400.

At block 404, the method 400 may be configured to determine an energy trellis associated with the symbols, the energy level of the symbols, the number of symbols to include in the sequence of symbols, and/or the maximum energy for the sequence of symbols. In some embodiments, the energy trellis may be analogous to the energy trellis of the visualization 300 of FIG. 3.

In some embodiments, the method 400 may be configured to determine one or more energy states that may be included in the energy trellis. For example, in instances in which the maximum energy for the sequence of symbols is twenty-eight and the number of symbols to include in the sequence of symbols is two, the energy trellis may be similar to the visualization 300, having four rows and three columns (i.e., the number of symbols to include in the sequence of symbols plus one). In some embodiments, a visualization of the energy trellis may include the energy states arranged in rows and columns. For example, the visualization of the energy trellis may include a number of columns equal to the number of symbols to include in the sequence of symbols plus one and a number of rows sufficient to accommodate the maximum energy for the sequence of symbols. Alternatively or additionally, the number of links between the energy states that may be included in a path from an initial energy state to a final energy state may be equal to the number of symbols to include in the sequence of symbols.

In some embodiments, the energy states may include incoming links and/or outgoing links, the links configured to connect one energy state with one or more adjacent energy states. For example, the third energy state 302d of FIG. 3 includes one incoming link from the initial energy state 302a and three outgoing links, with one link to the seventh energy state 302h and two links to the eighth energy state 302i. In some embodiments, the links between the energy states may be associated with the symbols and/or the associated energy level of the symbol. For example, the horizontal links of the links 310 of FIG. 3 (i.e., the links that connect energy states in the same row, such as the link between the fourth energy state 302e and the eighth energy state 302i) may be associated with a first symbol that may include an energy level equal to two. In these and other embodiments, the combinations of the incoming and/or outgoing links from each of the energy states may make up the one or more paths from the initial energy state to the final energy states.

In some embodiments, the outgoing links from a current energy state may be arranged according to the energy level of the symbol associated with the links. For example, as illustrated in FIG. 3, the first links 310a, as outgoing links from the initial energy state 302a, may be arranged such that the bottom link (i.e., the link between the initial energy state 302a and the first energy state 302b) may be associated with the first symbol of the symbols (such as the first symbol 210a of FIG. 2A) and the first symbol may include the smallest energy level of the symbols. From the bottom link, the arrangement of the links may increase in energy level. For example, above the bottom link, the next two links may be associated with a second symbol (the second symbol 210b of FIG. 2A) and a third symbol (the third symbol 210c of FIG. 2A) and may include an energy level of ten; the next link may be associated with a fourth symbol (the fourth symbol 210d of FIG. 2A) and may include an energy level of eighteen, and so forth.

In some embodiments, the arrangement of the outgoing links from the energy states may be limited by a number of the adjacent energy states. For example, as illustrated in FIG. 3, the third energy state 302d may only include three outgoing links, associated with the first symbol, the second symbol, and the third symbol, respectively, as there are not additional energy states adjacent to the third energy state 302d for the symbols with higher energy than the first three symbols.

In some embodiments, each energy state may include a first value and a second value, which may be illustrated in the visualization 300 of the energy trellis of FIG. 3. The first value may indicate the number of paths from the current energy state to a final energy state. For example, as illustrated in FIG. 3, the first value of the fourth energy state 302e is equal to one as only one path connects the fourth energy state 302e with a final energy state (i.e., the eighth energy state 302i). Further, as illustrated in FIG. 3, the first value of the initial energy state 302a is equal to nineteen, which may be determined by summing the first values of each energy state that includes a path from the initial energy state 302a, which includes summing an adjacent energy state for each path connected to it. For example, the first value of the initial energy state 302a may be equal to nineteen, which may be obtained by summing the first values of the first energy state 302b (i.e., six), the second energy state 302c twice, or once for each path between the initial energy state 302a and the second energy state 302c (i.e., eight), the third energy state 302d (i.e., three), and the fourth energy state 302e twice (i.e., two).

In some embodiments, the second value may represent the total energy level associated with the energy states and the energy level of the symbol whose link is connected to the energy state. For example, as illustrated in FIG. 3, the first energy state 302b includes a second value equal to two, where the link to the first energy state 302b is associated with a first symbol (such as first symbol 210a of FIG. 2A) and includes an energy level equal to two and the second value of the initial energy state 302a is equal to zero.

Further, as illustrated in FIG. 3, the sixth energy state 302g includes a second value equal to twelve, where the second value of the sixth energy state 302g may be determined by paths through two different energy states. The first path includes a first link of the first links 310a that includes an energy level equal to two and routing through the first energy state 302b, and a second link or a third link of the second links 310b that each include an energy level equal to ten. The second path includes a first link or a second link of the first links 310a that each include an energy level equal to ten and routing through the second energy state 302c, and a third link of the second links 310b that includes an energy level equal to two. Following either path, the second value for the sixth energy state 302g may be determined by summing the second value from each energy state that the path routed through, which, as illustrated in FIG. 3, is equal to twelve.

In some embodiments, the method 400 may be configured to determine one or more paths through the energy states. For example, as illustrated in FIG. 3, a path from the initial energy state 302a to the eighth energy state 302i may include one link from the first links 310a to the second energy state 302c and one link from the second links 310b to the eighth energy state 302i. In some embodiments and as illustrated in FIG. 3, the paths may include one of the first links 310a and one of the second links 310b such that a path may include a route from the initial energy state 302a to one of the final energy states.

At block 406, the method 400 may be configured to determine an index value. The index value may be based on a portion of the data signal. For example, in instances in which the data signal includes a binary stream of data, a portion of the data signal may be a segment of binary digits that may be converted to the index value. For example, the method 400 may obtain a segment of four bits and convert the segment to an index number, such as an index value of fifteen may be obtained from 1111 in binary. Alternatively or additionally, the method 400 may be configured to determine the index value based on different conversions of the portion of the data signal. For example, gray code to decimal conversion, various forms of lookup tables, and/or other similar conversion methods. In these and other embodiments, the index value may be configured such that a single index value may identify a portion of the data signal in each instance the portion of the data signal is processed. For example, a first portion of the data signal may be associated with a first index value and a second portion of the data signal, identical to the first portion and received and identified after the first portion, may be associated with the first index value.

At block 408, the index value may be compared to the first value of the adjacent energy states of the current energy state, so long as the adjacent energy state is located in the same row or rows that include a greater second value than the second value of the energy state in the same row. In some embodiments, the method 400 may be configured to determine one or more adjacent energy state whose combination of first values may be less than or equal to the index value. Further, the method 400 may be configured to select a link to an adjacent energy state where a combination of the first values associated with the paths below the selected link are less than or equal to the index value.

For example, given an index value equal to fifteen and using the visualization 300 of FIG. 3, the method 400 may select the fourth link, associated with the fourth symbol, which routes from the initial energy state 302a to the third energy state 302d. In the example, the total of the first values associated with the paths below the fourth link for comparison to the index value may be fourteen, which may include six from the first link to the first energy state 302b, four from the second link to the second energy state 302c, and four from the third link to the second energy state 302c.

At block 410, the symbol that may be associated with the link selected from block 410 may be saved. In some embodiments, the selected symbol may be appended to a sequence of symbols. In instances in which the selected symbol is the first symbol the method 400 has determined to be in a sequence of symbols, the selected symbol may be the first and only symbol in the sequence of symbols. Alternatively or additionally, the selected symbol from block 408 may be added following the last added symbol to the sequence of symbols.

At block 412, the method 400 may determine an updated index value. In some embodiments, the updated index value may include subtracting the total of the first values associated with the paths below the selected link from the current index value. Using the previous example with the index value equal to fifteen and the total of the first values associated with the paths below the fourth link equal to fourteen, the updated index value may be equal to one.

At block 414, the method 400 may determine whether the current energy state is a final energy state. For example, the visualization 300 of FIG. 3, the method 400 may be configured to determine the current energy state is a final energy state in instances in which the current energy state includes no adjacent energy states in columns to the right of the column of the current energy state. For example, the method 400 may be configured to determine the fifth energy state 302f, the sixth energy state 302g, the seventh energy state 302h, and the eighth energy state 302i may be determined to be final energy states.

In instances in which the current energy state is not a final energy state, the method 400 may move to block 408 and continue iterating as described with respect to FIG. 4. Alternatively, in instances in which the current energy state is not a final energy state, the method 400 may move to block 416.

Continuing the example, having selected the fourth symbol to append to the sequence of symbols, the method 400 may continue at block 408, by comparing the updated index value (i.e., one) to the first value of the adjacent energy states, as described at block 408. Based on the comparison, the method 400 may select the second link, associated with the second symbol, which routes from the third energy state 302d to the eighth energy state 302i. The method 400 may append the second symbol to the sequence of symbols, as described relative to block 410. The method 400 may determine an updated index by subtracting the total of the first values associated with the paths below the selected link from the current index value. In the current example, with the index value equal to one and the total of the first values associated with the paths below the fourth link equal to one, the updated index value may be equal to zero. The method 400 may determine that the current energy state is a final energy state and may move to block 416.

At block 416, the sequence of symbols may be finalized, and the sequence of symbols may be configured to output to another device. For example, in instances in which the method 400 is performed in the distribution matcher 113 of FIG. 1, the sequence of symbols may be output to the FEC encoder 115. Continuing the example, the sequence of symbols associated with an index value of fifteen and the energy trellis as illustrated in FIG. 3 may include the fourth symbol in a first symbol position and the second symbol in a second symbol position.

Modifications, additions, or omissions may be made to the method 400 without departing from the scope of the present disclosure. For example, one or more of the decision steps and/or the operation steps may be combined into fewer blocks or separated into additional blocks.

Additionally, the method 400 may illustrate a method of encoding a data signal into a sequence of symbols. It will be appreciated that a similar method to method 400 may be performed in reverse to decode the encoded data signal, such as in the distribution de-matcher 127 of the receiving unit 120 of FIG. 1. For example, a method of decoding may begin with a sequence of symbols and may begin at an initial energy state of an energy trellis similar to the energy trellis used in the method 400, such as the visualization 300 of FIG. 3. The method for decoding may navigate the energy trellis by following the path defined by the links associated with the sequence of symbols and adding the first values associated with the energy states connected to the links associated with the symbols to determine an index value. With the determined index value, the method of decoding may be configured to determine a portion of the data signal using an inverse method of the method described in block 406, to convert the index value into a portion of the data signal.

Figure 5:
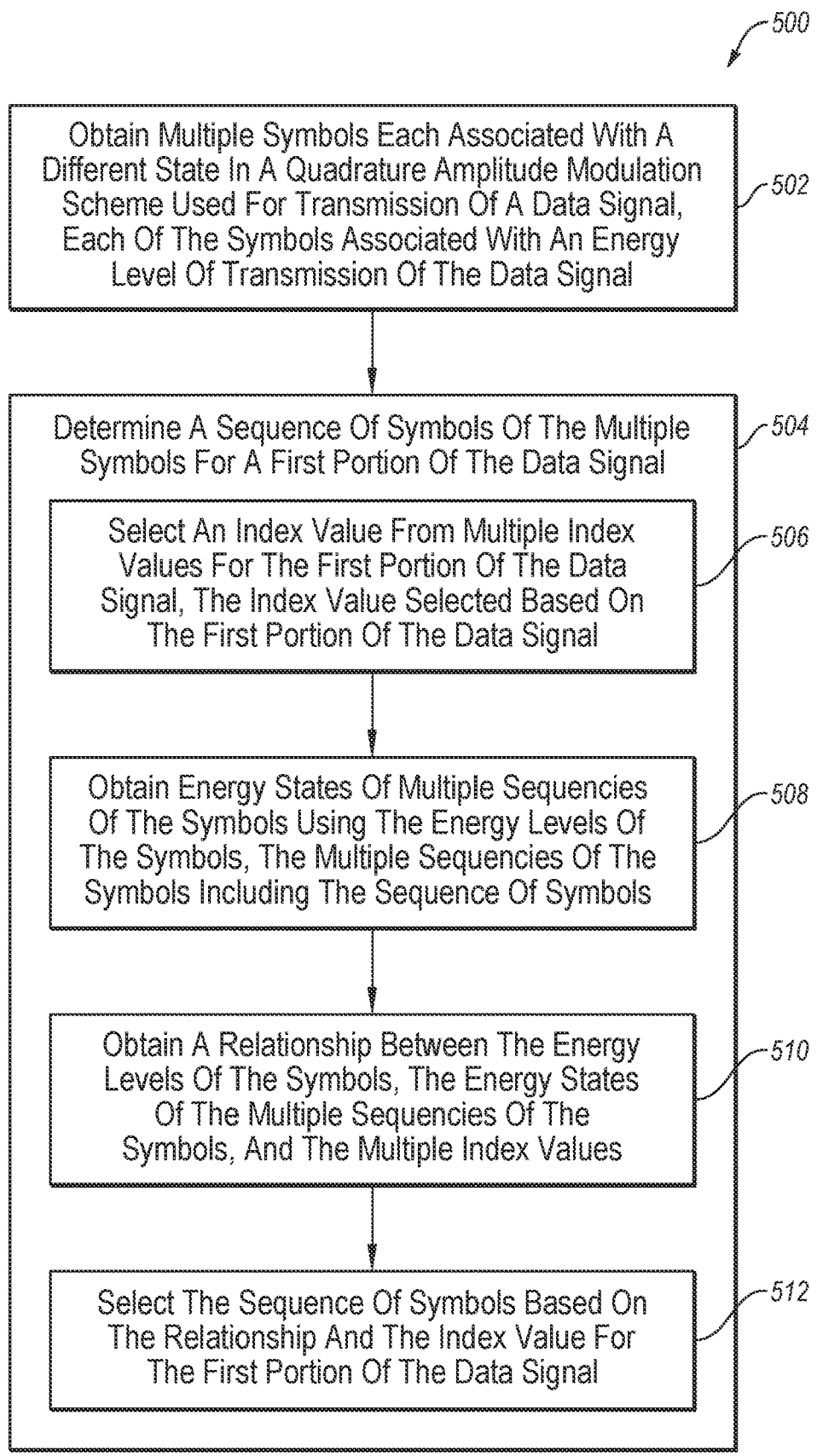
FIG. 5 illustrates a flowchart of an example method of encoding data.

FIG. 5 illustrates a flowchart of an example method 500. The method 500 may be arranged in accordance with at least one embodiment described in the present disclosure. One or more operations of the method 500 may be performed, in some embodiments, by a device or system, such as the transmitting unit 110 of FIG. 1, the system 600 of FIG. 6, or another device, combination of devices, or system. In these and other embodiments, the method 500 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method may begin at block 502 where multiple symbols each associated with a different state in a quadrature amplitude modulation scheme used for transmission of a data signal may be obtained. Each of the symbols may be associated with an energy level of transmission of the data signal.

At block 504, a sequence of symbols of the multiple symbols for a first portion of the data signal may be determined. The determining the sequence of symbols may include blocks 506, 508, 510, and/or 512.

At block 506, an index value from multiple index values for the first portion of the data signal may be selected. The index value selected may be based on the first portion of the data signal. In some embodiments, a number of the multiple index values may be based on the energy levels of the symbols. In some embodiments, the first portion of the data signal may represent N number of bits. In some embodiments, a number of the multiple index values may be equal to or greater than two to the Nth power.

At block 508, energy states of multiple sequences of the symbols using the energy levels of the symbols may be obtained. The multiple sequences of the symbols may include the sequence of symbols. In some embodiments, the energy states of the sequences of the symbols may be organized in rows and columns. For example, a number of columns may be based on a number of symbols in the sequence of symbols and a number of rows may be based on a maximum energy level for determined sequences of symbols and the energy levels of the multiple symbols.

In some embodiments, in response to energy levels of two or more of the multiple symbols being the same, one or more of a pair of energy states may include multiple links therebetween represented by the two or more of the multiple symbols with the same energy levels. In some embodiments, a number of the multiple index values may be based on a number of links between the energy states. In some embodiments, a number of the multiple sequences of the symbols may be based on a number of symbols in the sequence of symbols. Alternatively or additionally, the number of the multiple sequences of the symbols may be based on a maximum energy level for a determined sequence of symbols.

At block 510, a relationship between the energy levels of the symbols, the energy states of the multiple sequences of the symbols, and the multiple index values may be obtained. In some embodiments, the relationship may be based on a representation of the energy states of the sequences of the symbols organized based on a number of symbols in the sequence of symbols with links between the energy states associated with the energy levels of the symbols.

At block 512, the sequence of symbols based on the relationship and the index value for the first portion of the data signal may be selected. In some embodiments, selecting the sequence of symbols may include selecting a first symbol of the sequence of symbols. In some embodiments, selecting the first symbol may include selecting a path between the energy states based on comparing the index value to a number of paths from a current energy state of sequences of the symbols to a final energy state of sequences of the symbols based on the links between the energy states. Selecting the first symbol may further include selecting a symbol associated with a link in the selected path as the first symbol. In some embodiments, the selecting of the sequence of symbols may be performed in real-time as part of transmission of the data signal.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

Figure 6:
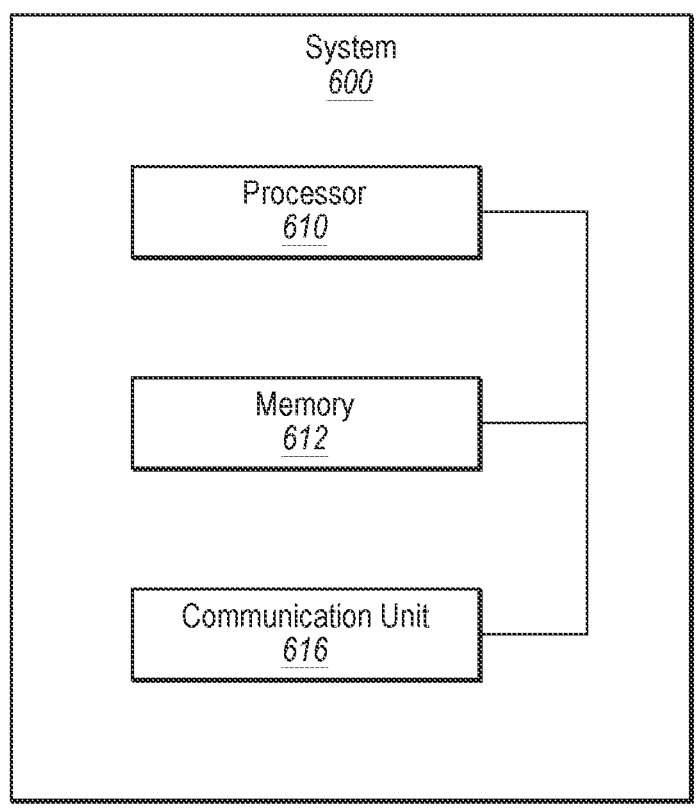
FIG. 6 illustrates an example system that may be used for encoding data.

FIG. 6 is a block diagram illustrating an example system 600 that may be used for encoding data, according to at least one embodiment of the present disclosure. The system 600 may include a processor 610, memory 612, and a communication unit 616, which all may be communicatively coupled. In some embodiments, the system 600 may be part of any of the systems or devices described in this disclosure.

For example, the system 600 may be part of the transmitting unit 110 of FIG. 1 and may be configured to perform one or more of the tasks described above with respect to the transmitting unit 110. As another example, the system 600 may be part of the receiving unit 120 and may be configured to perform one or more of the tasks described above.

Generally, the processor 610 may include any computing entity, or processing device including various computer hardware or software modules and may be configured to execute instructions stored on any applicable computer-readable storage media. For example, the processor 610 may include a microprocessor, a microcontroller, a parallel processor such as a graphics processing unit (GPU) or tensor processing unit (TPU), a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 6, it is understood that the processor 610 may include any number of processors distributed across any number of networks or physical locations that are configured to perform individually or collectively any number of operations described herein. In some embodiments, the processor 610 may interpret and/or execute program instructions and/or process data stored in the memory 612. In some embodiments, the processor 610 may execute the program instructions stored in the memory 612.

For example, in some embodiments, the processor 610 may execute program instructions stored in the memory 612 that are related to path encoding with delay constraints such that the system 600 may perform or direct the performance of the operations associated therewith as directed by the instructions. In these and other embodiments, the instructions may be used to perform one or more operations of FIG. 4, or the method 500 of FIG. 5.

The memory 612 may include computer-readable storage media or one or more computer-readable storage mediums for carrying or having computer-executable instructions or data structures stored thereon. Such computer-readable storage media may be any available media that may be accessed by a general-purpose or special-purpose computer, such as the processor 610.

By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media.

Computer-executable instructions may include, for example, instructions and data configured to cause the processor 610 to perform a certain operation or group of operations as described in this disclosure. In these and other embodiments, the term "non-transitory" as explained in the present disclosure should be construed to exclude only those types of transitory media that were found to fall outside the scope of patentable subject matter in the Federal Circuit decision of In re Nuijten, 500 F.3d 1346 (Fed. Cir. 2007). Combinations of the above may also be included within the scope of computer-readable media.

The communication unit 616 may include any component, device, system, or combination thereof that is configured to transmit or receive information over a network. In some embodiments, the communication unit 616 may communicate with other devices at other locations, the same location, or even other components within the same system. For example, the communication unit 616 may include a modem, a network card (wireless or wired), an infrared communication device, a wireless communication device (such as an antenna), and/or chipset (such as a Bluetooth® device, an 802.6 device (e.g., Metropolitan Area Network (MAN)), a WiFi device, a WiMax device, cellular communication facilities, etc.), and/or the like. The communication unit 616 may permit data to be exchanged with a network and/or any other devices or systems described in the present disclosure. For example, when the system 600 is included in the transmitting unit 110 of FIG. 1, the communication unit 616 may allow the transmitting unit 110 to communicate with the receiving unit 120.

Modifications, additions, or omissions may be made to the system 600 without departing from the scope of the present disclosure. For example, in some embodiments, the system 600 may include any number of other components that may not be explicitly illustrated or described. Further, depending on certain implementations, the system 600 may not include one or more of the components illustrated and described.

As indicated above, the embodiments described herein may include the use of a computing system (e.g., the processor 610 of FIG. 6) including various computer hardware or software modules, as discussed in greater detail below. Further, as indicated above, embodiments described herein may be implemented using computer-readable media (e.g., the memory 612 of FIG. 6) for carrying or having computer-executable instructions or data structures stored thereon.

In some embodiments, the different components, modules, engines, and services described herein may be implemented as objects or processes that execute on a computing system (e.g., as separate threads). While some of the systems and methods described herein are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A method for encoding data, comprising:
    obtaining a plurality of symbols each associated with a different state in a quadrature amplitude modulation scheme used for transmission of a data signal, each of the symbols associated with an energy level of transmission of the data signal;
    determining a sequence of symbols of the plurality of symbols for a first portion of the data signal, the determining including:
        selecting an index value from a plurality of index values for the first portion of the data signal, the index value selected based on the first portion of the data signal;
        obtaining energy states of a plurality of sequences of the symbols using the energy levels of the symbols, the plurality of sequences of the symbols including the sequence of symbols;
        obtaining a relationship between the energy levels of the symbols, the energy states of the plurality of sequences of the symbols, and the plurality of index values, wherein the relationship is based on a representation of energy states of the sequences of the symbols and in the representation the energy states are connected via links and each of the links represents an energy level of a symbol included in the plurality of sequences of the symbols; and
        selecting the sequence of symbols based on the relationship and the index value for the first portion of the data signal;
    encoding the first portion of the data using the determined sequence of symbols; and
    transmitting the encoded first portion of the data.

2. The method of claim 1, wherein selecting the sequence of symbols includes selecting a first symbol of the sequence of symbols, selecting the first symbol including:
    selecting a path between the energy states based on comparing the index value to a number of paths from a current energy state of sequences of the symbols to a final energy state of sequences of the symbols based on the links between the energy states; and
    selecting a symbol associated with a link in the selected path as the first symbol.

3. The method of claim 1, wherein the energy states of the sequences of the symbols are organized in rows and columns, a number of columns based on a number of symbols in the sequence of symbols and a number of rows based on a maximum energy level for determined sequences of symbols and energy levels of the plurality of symbols.

4. The method of claim 1, wherein in response to energy levels of two or more of the plurality of symbols being the same, one or more of a pair of energy states includes multiple links therebetween represented by the two or more of the plurality of symbols with the same energy levels.

5. The method of claim 1, wherein a number of the plurality of index values is based on a number of paths along the links between the energy states.

6. The method of claim 1, wherein a number of the plurality of sequences of the symbols is based on a number of symbols in the sequence of symbols and a maximum energy level for the determined sequences of symbols.

7. The method of claim 1, wherein a number of the plurality of index values is based on energy levels of the symbols.

8. The method of claim 1, wherein the selecting of the sequence of symbols is performed in real-time as part of transmission of the data signal.

9. The method of claim 1, wherein the first portion of the data signal represents N number of bits and a number of the plurality of index values is equal to or greater than two to the Nth power.

10. A system comprising:
    one or more computer-readable storage media configured to store instructions; and
    one or more processors communicatively coupled to the one or more computer-readable storage media and configured to, in response to execution of the instruction, cause the system to perform operations, the operations comprising:
        obtaining a plurality of symbols each associated with a different state in a quadrature amplitude modulation scheme used for transmission of a data signal, each of the symbols associated with an energy level of transmission of the data signal;
        determining a sequence of symbols of the plurality of symbols for a first portion of the data signal, the determining including:
            selecting an index value from a plurality of index values for the first portion of the data signal, the index value selected based on the first portion of the data signal;

obtaining energy states of a plurality of sequences of the symbols using the energy levels of the symbols, the plurality of sequences of the symbols including the sequence of symbols;

obtaining a relationship between the energy levels of the symbols, the energy states of the plurality of sequences of the symbols, and the plurality of index values, wherein the relationship is based on a representation of energy states of the sequences of the symbols and in the representation the energy states are connected via links and each of the links represents an energy level of a symbol included in the plurality of sequences of the symbols; and selecting the sequence of symbols based on the relationship and the index value for the first portion of the data signal;

encoding the first portion of the data using the determined sequence of symbols; and direct transmission of the encoded first portion of the data.

11. The system of claim 10, wherein selecting the sequence of symbols includes selecting a first symbol of the sequence of symbols, selecting the first symbol including:

selecting a path between the energy states based on comparing the index value to a number of paths from a current energy state of sequences of the symbols to a final energy state of sequences of the symbols based on the links between the energy states; and selecting a symbol associated with a link in the selected path as the first symbol.

12. The system of claim 10, wherein the energy states of the sequences of the symbols are organized in rows and columns, a number of columns based on a number of symbols in the sequence of symbols and a number of rows based on a maximum energy level for determined sequences of symbols and energy levels of the plurality of symbols.

13. The system of claim 10, wherein in response to energy levels of two or more of the plurality of symbols being the same, one or more of a pair of energy states includes multiple links therebetween represented by the two or more of the plurality of symbols with the same energy levels.

14. The system of claim 10, wherein a number of the plurality of index values is based on a number of paths along the links between the energy states.

15. The system of claim 10, wherein a number of the plurality of sequences of the symbols is based on a number of symbols in the sequence of symbols and a maximum energy level for the determined sequences of symbols.

16. The system of claim 10, wherein a number of the plurality of index values is based on energy levels of the symbols.

17. The system of claim 10, wherein the selecting of the sequence of symbols is performed in real-time as part of transmission of the data signal.

18. The system of claim 10, wherein the first portion of the data signal represents N number of bits and a number of the plurality of index values is equal to or greater than two to the Nth power.

19. A method for encoding data, comprising:

obtaining a plurality of symbols each associated with a different state in a quadrature amplitude modulation scheme used for transmission of a data signal, each of the symbols associated with an energy level of transmission of the data signal;

determining a sequence of symbols of the plurality of symbols for a first portion of the data signal, the determining including:

selecting an index value from a plurality of index values for the first portion of the data signal, the index value selected based on the first portion of the data signal;

obtaining energy states of a plurality of sequences of the symbols using the energy levels of the symbols, the plurality of sequences of the symbols including the sequence of symbols and a number of the plurality of sequences of the symbols is based on a number of symbols in the sequence of symbols and a maximum energy level for the determined sequences of symbols;

obtaining a relationship between the energy levels of the symbols, the energy states of the plurality of sequences of the symbols, and the plurality of index values; and selecting the sequence of symbols based on the relationship and the index value for the first portion of the data signal;

encoding the first portion of the data using the determined sequence of symbols; and transmitting the encoded first portion of the data.

* * * * *